(12) United States Patent
Weiland et al.

(10) Patent No.: US 6,787,800 B2
(45) Date of Patent: Sep. 7, 2004

(54) TEST VEHICLE WITH ZIG-ZAG STRUCTURES

(75) Inventors: Larg H. Weiland, San Ramon, CA (US); Christopher Hess, San Ramon, CA (US)

(73) Assignee: PDF Solutions, Inc., San Jose, CA (US)

( * ) Notice: Subject to any disclaimer, the term of this patent is extended or adjusted under 35 U.S.C. 154(b) by 0 days.

(21) Appl. No.: 10/202,278

(22) Filed: Jul. 24, 2002

(65) Prior Publication Data

US 2003/0020503 A1 Jan. 30, 2003

Related U.S. Application Data

(60) Provisional application No. 60/307,398, filed on Jul. 24, 2001.

(51) Int. Cl.[7] .............................................. H01L 29/10
(52) U.S. Cl. ........................................ 257/48; 257/774
(58) Field of Search .................. 257/774, 48; 438/381; 365/201

(56) References Cited

U.S. PATENT DOCUMENTS 6,475,871 B1 * 11/2002 Stine et al. .................. 438/381

OTHER PUBLICATIONS

Doong, K. et al., Design and SImulation of Addressable Failure Site Test Structure for IC Process Control Monitor, pp. 219–222 Worldwise Semiconductor Manufacturing Corp. Shinchu, Taiwan.*

Doong, K. et al., Design and Simulation of Addressable Failure Site Test Structure for IC Process Control Monitor, pp. 219–222, Worldwide Semiconductor Manufacturing Corp. Shinchu, Taiwan; Microelectronics Laboratory, Semiconductor Technology & Application Research (STAR) Group, Dept. of Electrical Engineering, National Tsing–Hua University, R.O.C..

Hess and Weiland, Influence of Short Circuits on Data of Contact and Via Open Circuits Determined by a Novel Weave Test Structure, pp. 27–34, IEEE Transactions on Semiconductor Manufacturing, vol. 9 No. 1, Feb. 1996.

Stapper and Rosner, Integrated Circuit Yield Management and Yield Analysis: Development and Implementation, pp. 95–102, IEEE Transactions on Semiconductor Manufacturing, vol. 8, No. 2, May 1995.

* cited by examiner

*Primary Examiner*—Roy Potter
(74) *Attorney, Agent, or Firm*—Duane Morris LLP; Steven E. Koffs

(57) ABSTRACT

A test vehicle has a plurality of the zig-zag structures which include: a first layer having a plurality of first elongated patterns oriented in a first direction; a second layer having a plurality of second elongated patterns oriented in a second direction substantially perpendicular to the first direction; and a plurality of vias or contacts conductively coupling ones of the first patterns to respective ones of the second patterns.

16 Claims, 14 Drawing Sheets

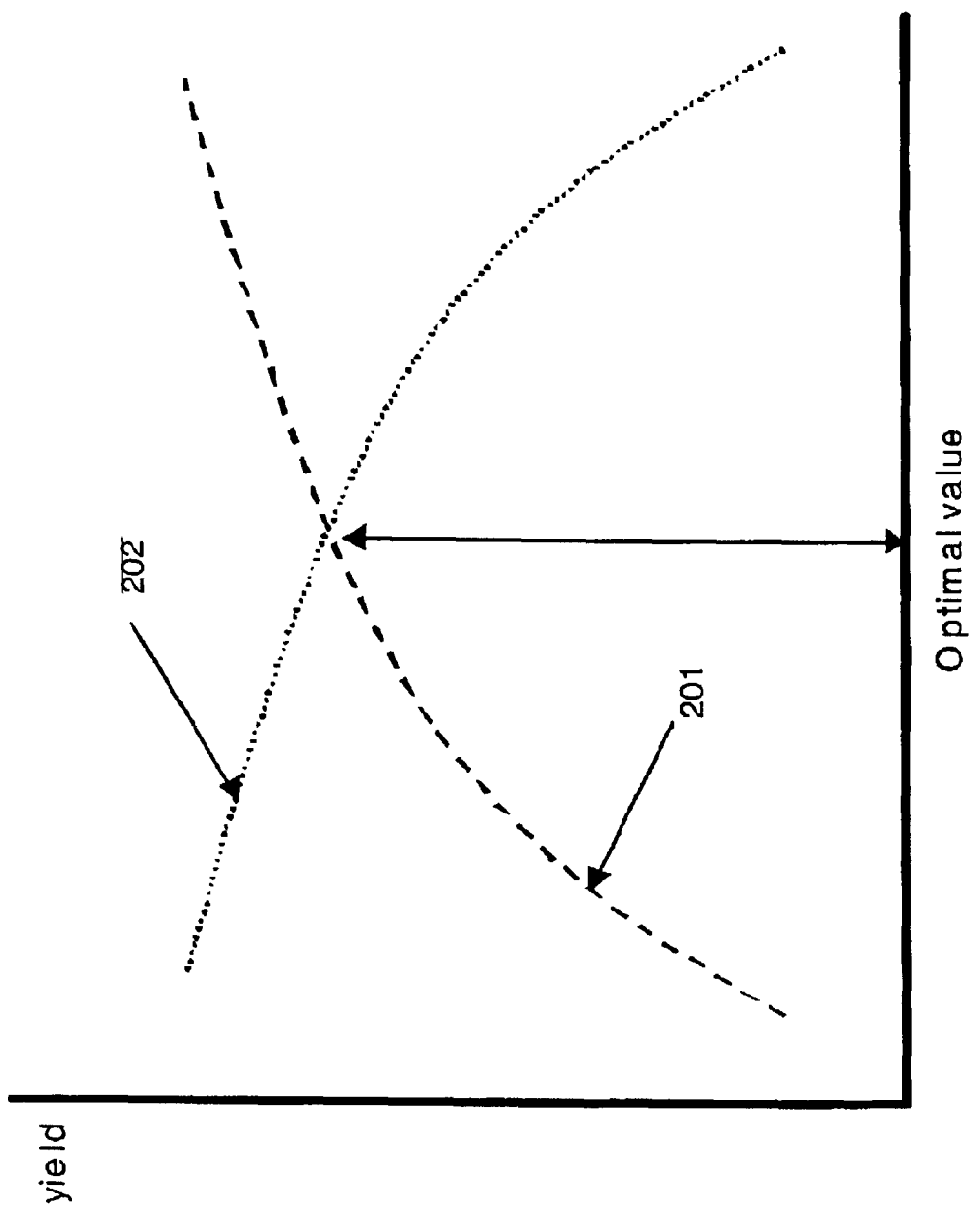

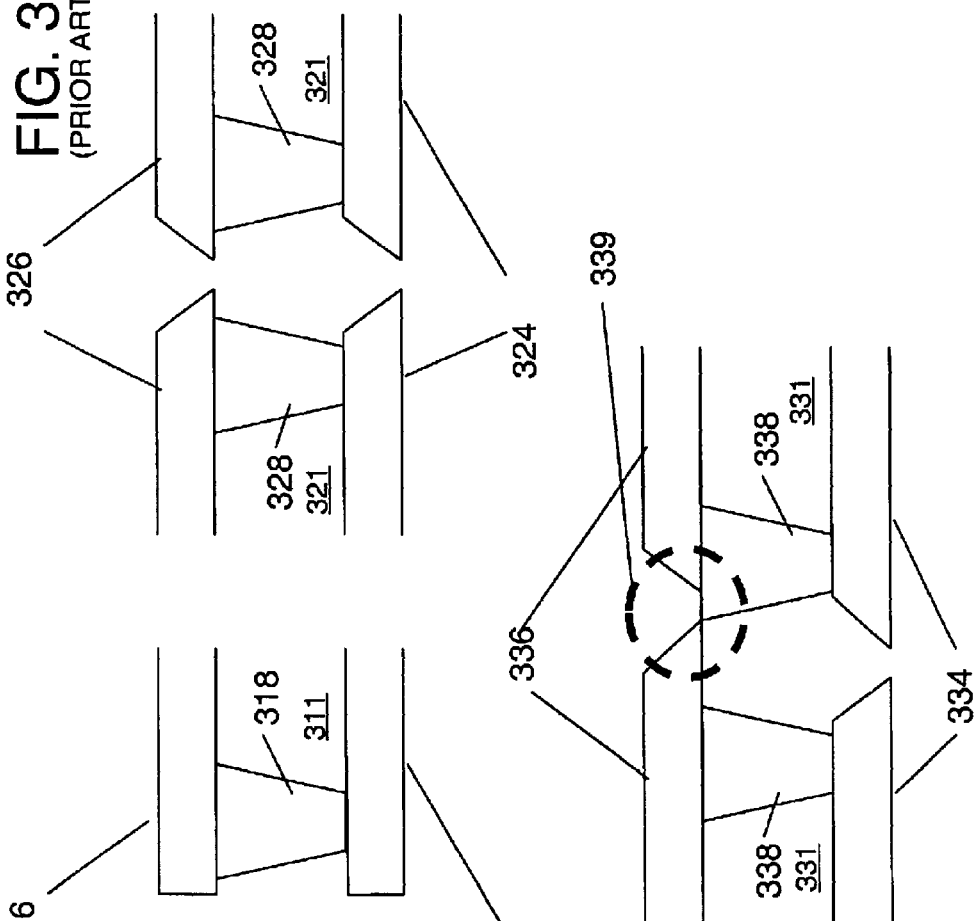

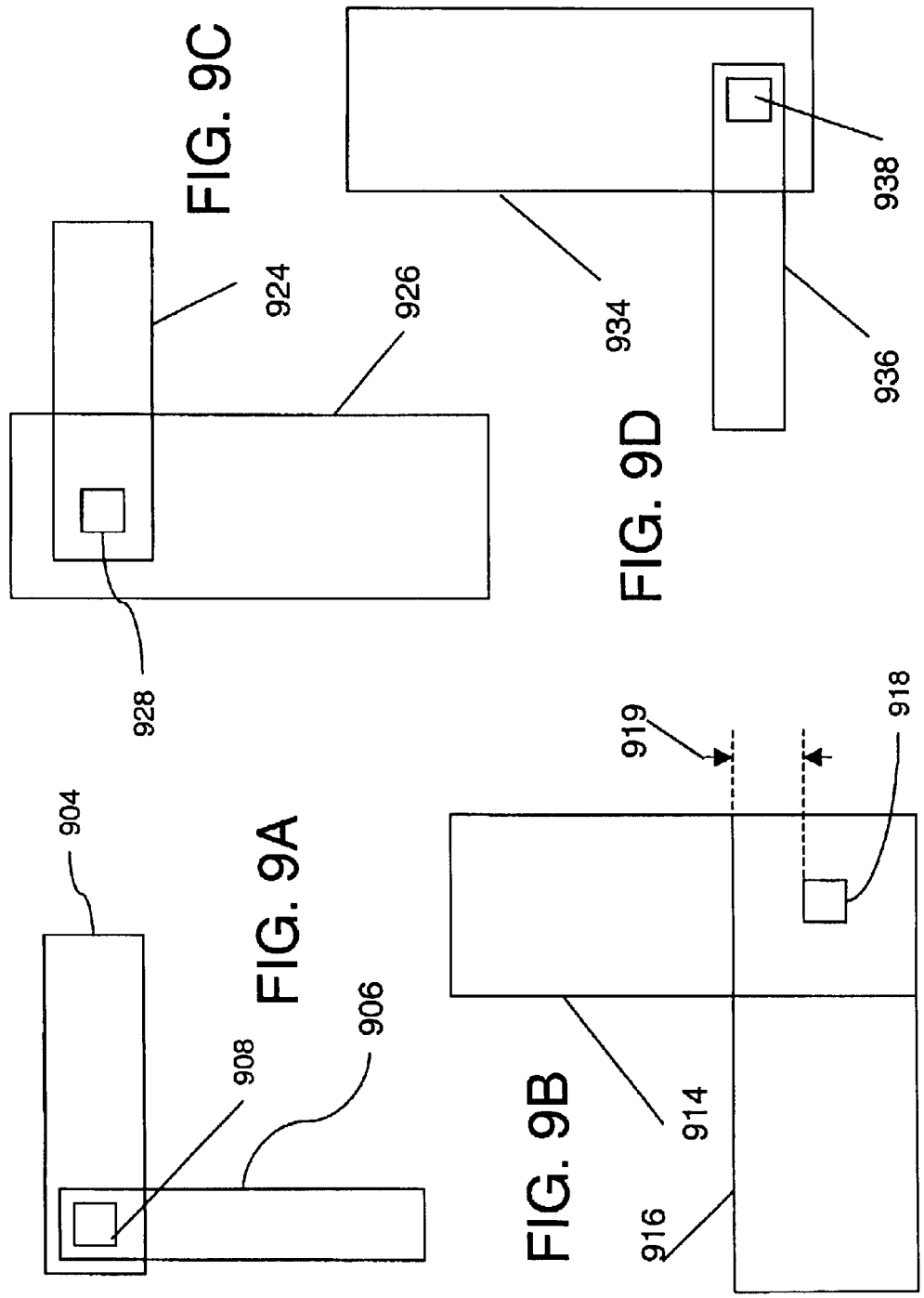

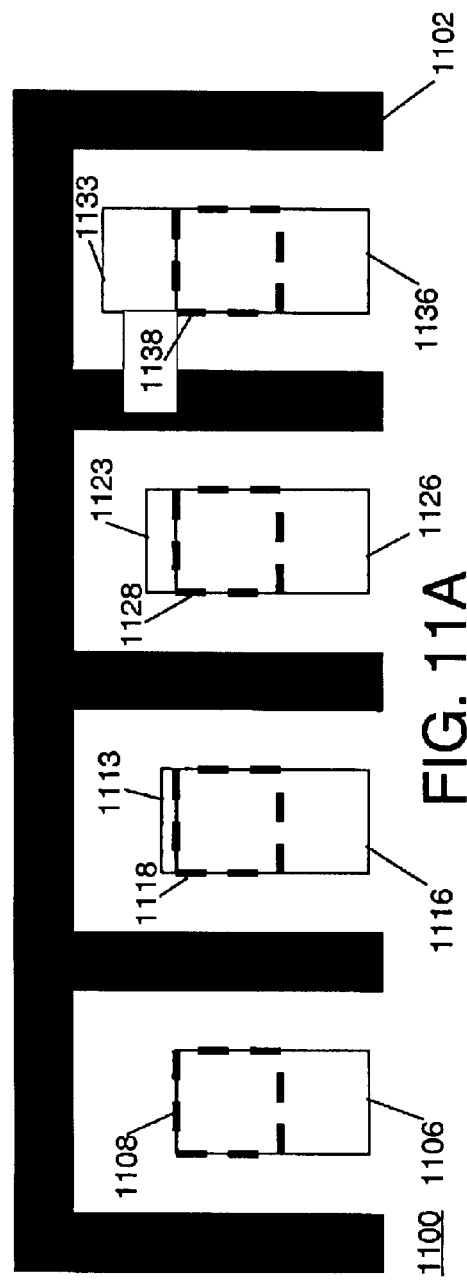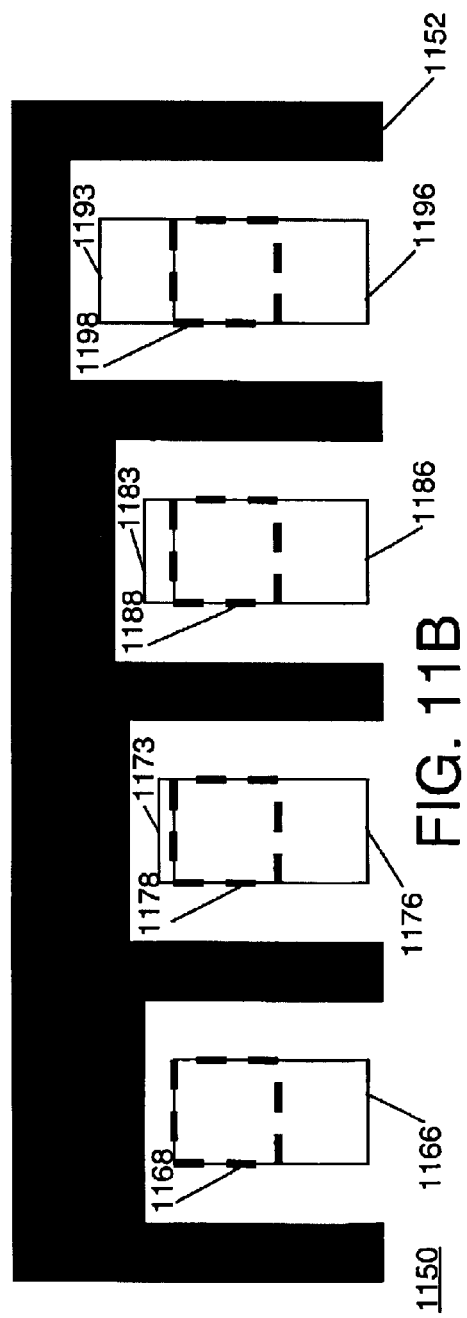

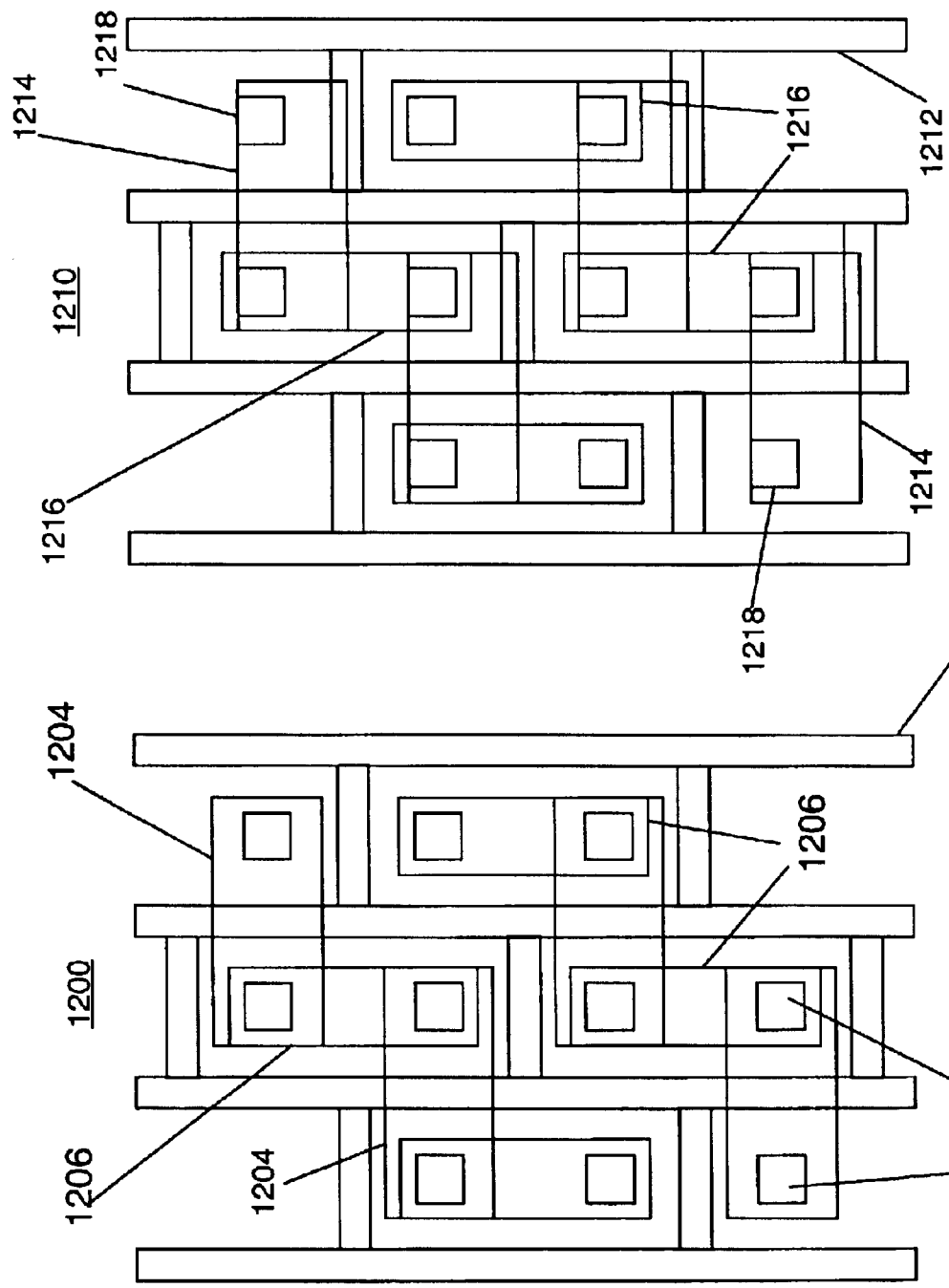

US 6,787,800 B2

TEST VEHICLE WITH ZIG-ZAG STRUCTURES

This application claims the benefit of U.S. Provisional Patent Application No. 60/307,398, filed Jul. 24, 2001.

FIELD OF INVENTION

This invention relates to methods for measuring and evaluating the process and design related statistical variations of an integrated circuit manufacturing process in order to determine their sources and their effects on the yield and performance of the product.

BACKGROUND

Defects (e. g. particles) can cause electrically measurable faults (killer defects), which are dependent on the chip layout as well as the layer and location of the defects. These faults are responsible for manufacturing related malfunction of chips. So, a layer and fault sensitive defect density is important for yield enhancement and to control quality of process steps and product chips, as discussed in Staper, C. H., Rosner, R. J., "Integrated Circuit Yield Management and Yield Analysis: Development and Implementation," IEEE Transactions on Semiconductor Manufacturing, pp. 95–102, Vol. 8, No. 2, 1995, which is incorporated by reference herein. Test structures are used to detect faults and to identify and localize defects.

A chain of vias and/or contacts are usually used to observe the integrity of Inter Layer Dielectric (ILD) layers. FIGS. 1A–1C show a typical via chain, of a type described in Ipri, A. C., Sarace, J. C., "Integrated Circuit Process and Design Rule Evaluation Techniques," RCA Review, pp. 323–350, Volume 38, Number 3, September 1977, and Buehler, M. G., "Microelectronic Test Chips for VLSI Electronics," VLSI Electronics Microstructure Science, pp. 529–576, Vol 9, Chapter 9, Academic Press, 1983, both of which are incorporated by reference herein. FIG. 1A shows the total layout used to check chain continuity/resistance, including the bottom polysilicon (P-Si) layer 114, and the metallization (M1) layer 116, with contacts 118 for the vias between the layers. FIG. 1B shows the bottom P-Si pattern. FIG. 1C shows the top M1 pattern.

FIG. 3A shows facing line ends in a dense environment. Layer 314 may be a poly-silicon (P-Si) layer. Layer 316 may be a metallization layer. Vias 314 in the ILD 311 connect layers 314, and 316.

FIG. 3B shows facing line ends in an isolated environment, including P-Si layer 324, metallization layer 326 and vias 328. If a defect occurs in the ILD layer 321, the via 328 between the upper and lower conducting layers 326 and 324, respectively, will fail and result in a measurable short circuit (not shown).

FIG. 3C shows facing line ends in an isolated environment with top metal misalignment, including P-Si layer 334, metallization layer 336 and ILD 331 with vias 338. Beside defect dependent open vias, misalignment between the via 338 and conducting layers 336 can occur in product chips during the manufacturing steps. This can also cause short circuits 339 within the metal layer 336 as shown in FIG. 3C. In addition to that, the space between metal lines will vary due to the metal density in deep submicron technologies using Deep Ultra Violet (DUV) (short light wave length) and beyond lithography steps.

Furthermore, so-called line end shortening effects as illustrated in FIG. 4 are becoming an important yield-limiting factor. FIG. 4 shows line end shortening effect and its impact on possible open circuit faults in the via/contact layer as well as its impact on possible short circuit faults in the metal layer. Only the upper metal layer and contacts are shown in FIG. 4, for ease of viewing. The metal patterns are indicated by 402a, 402b, 404a, 404b, 406a, 406b, 408a, 408b, 411a, and 411b. Contacts are indicated by 401a, 401b, 403a, 403b, 405a, 405b, 407a, 407b, 409a, 409b, 410a and 410b. Metal patterns 406a and 406b are nominally sized and provide complete coverage over respective contacts 405a and 405b, reflected in low resistance. Metal patterns 402a, 402b, 404a and 404b are shortened, resulting in reduced overlap with respective contacts 401a, 401b, 403a and 403b. This increases resistance, and may result in open circuits, for example, in the case of contacts 401a and 401b. Metal patterns 408a, 408b, 411a and 411b have respective extensions 409a, 409b, 412a and 412b. If excessively long, the extensions may result in a short circuit, for example in the case of extensions 412a and 412b.

FIG. 2 shows the tradeoff between the yield loss of via open circuit faults (curve 201) and the yield loss of metal short circuit faults (curve 202). The X-axis represents the via border overlap (in the case of open circuit faults) or line extension (in the case of short circuit faults). That is, the X-axis shows the extension of the metal or poly layer over the contact or via, respectively. The sum of these two curves may be approximated by a downward-facing parabola (not shown). To ensure optimal yield of product chips within such a manufacturing environment, the yield loss of metal short circuit faults 202 has to be balanced against yield loss of via open circuit faults 201 as shown in FIG. 2. The optimal value is that at which the total yield loss is minimized (or total yield is maximized).

Two parallel via chains as described in Doong, K., Cheng, J., Hsu, C., "Design and Simulation of Addressable Fault Site Test Structure for IC Process Control Monitor," International Symposium on Semiconductor Manufacturing, 1999, which is incorporated herein by reference. Multiple interwoven via chains which allow for the detection of open and short circuits are described in Hess, C., Weiland, L. H., "Influence of Short Circuits on Data of Contact & Via Open Circuits Determined by a Novel Weave Test Structure," IEEE Transactions on Semiconductor Manufacturing, pp. 27–34, Vol. 9, No. 1, 1996, which is incorporated herein by reference.

Improved test vehicles are desired.

SUMMARY OF THE INVENTION

The present invention is a test vehicle having a plurality of zig-zag structures.

BRIEF DESCRIPTION OF THE DRAWINGS

FIG. 2 is a diagram showing the tradeoff between yield losses due to metal short circuit faults and yield losses due to open circuit faults.

FIGS. 3A–3C show how facing line ends in an isolated environment can result in short circuits, when the top metal layer is mis-aligned with the vias.

FIGS. 9A–9D show how the metal overlap can be varied to enable the separation of three different effects: landing, coverage and hole effects.

FIGS. 11A and 11B show structures for characterizing the interaction between line extension and the neighborhood structures.

FIGS. 12A–12C show structures for characterizing the effects of misalignments of the various layers, including contact misalignment or top layer misalignment.

DETAILED DESCRIPTION

U.S. patent application Ser. No. 09/442,699, filed Nov. 18, 1999, is incorporated by reference herein in its entirety, for its teachings on methods and systems for yield prediction, including the fabrication of short flow test vehicles and analysis of data collected therefrom. U.S. Provisional Patent Application No. 60/307,398, filed Jul. 24, 2001 is incorporated by reference herein in its entirety.

The above-referenced methods described in the background section are not capable of measuring short circuits in all directions.

Figure 1C:
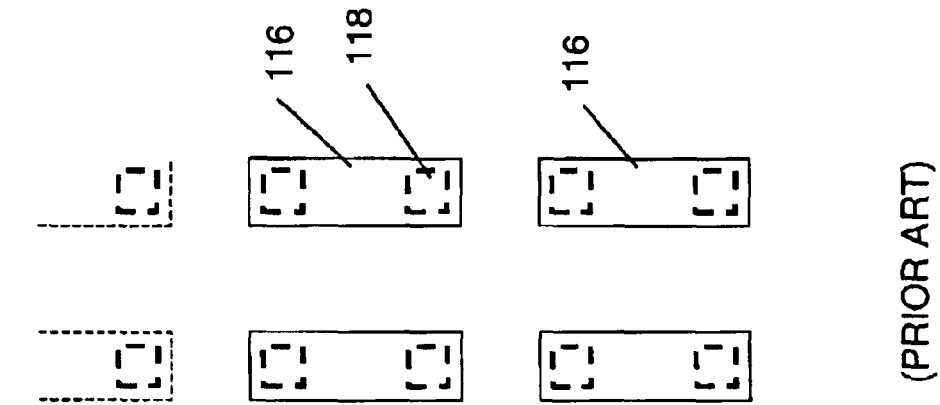
FIG. 1 shows conventional via chains used in conventional test vehicles.
Figure 1B:
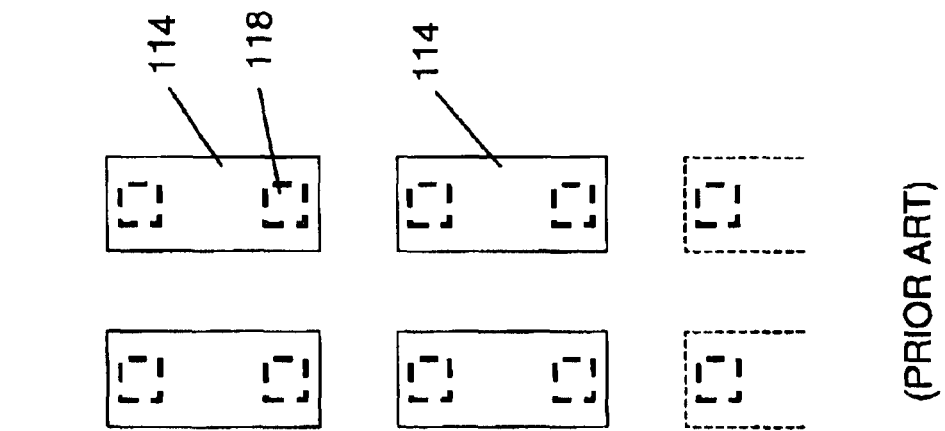
Figure 1A:
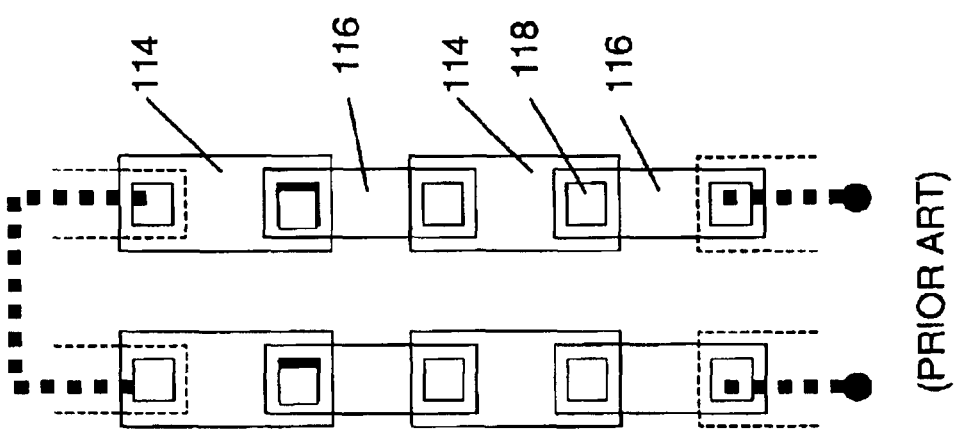
Figure 4:
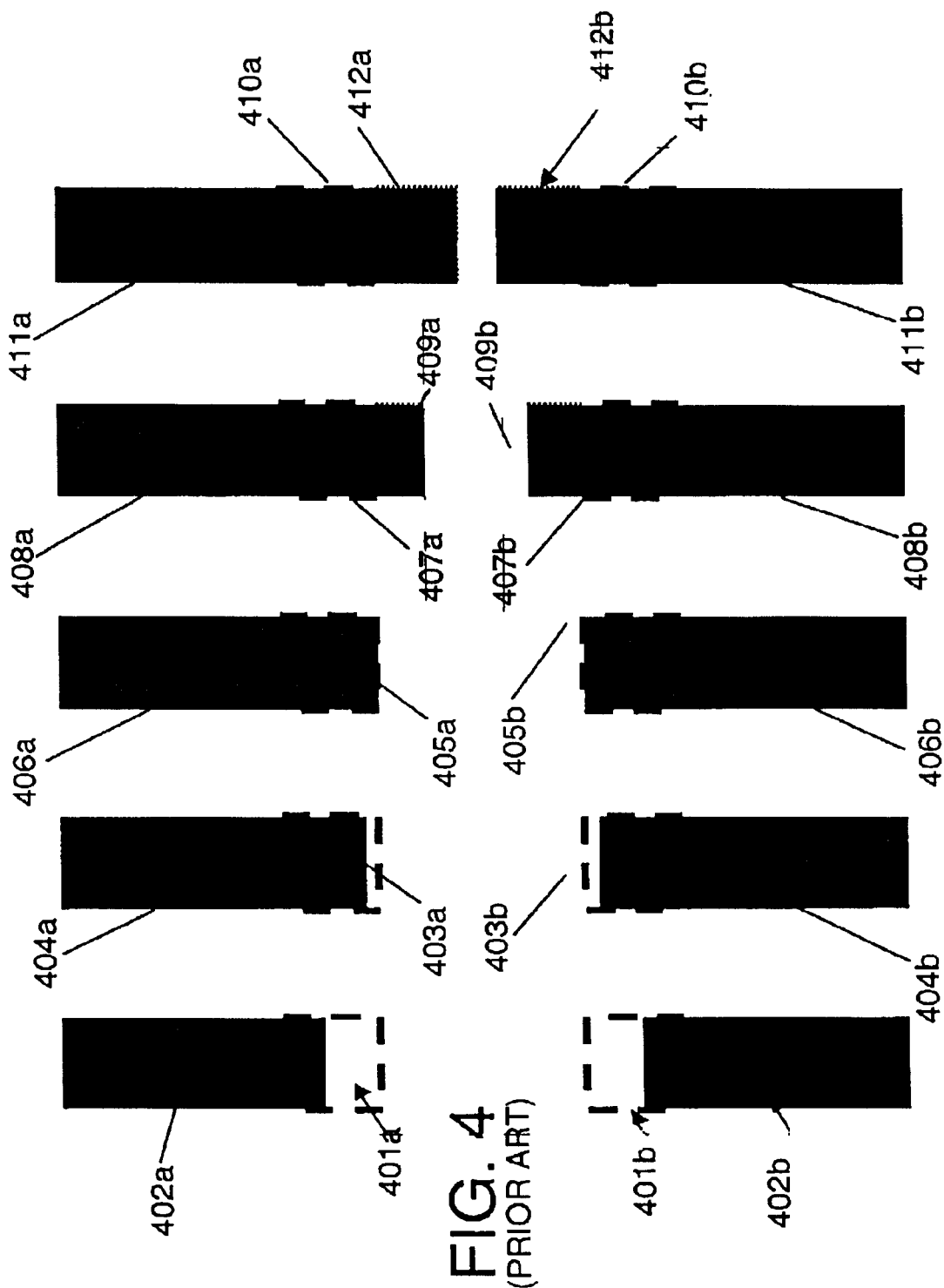
FIG. 4 shows metal patterns which exhibit the line end shortening effect
Figure 5:
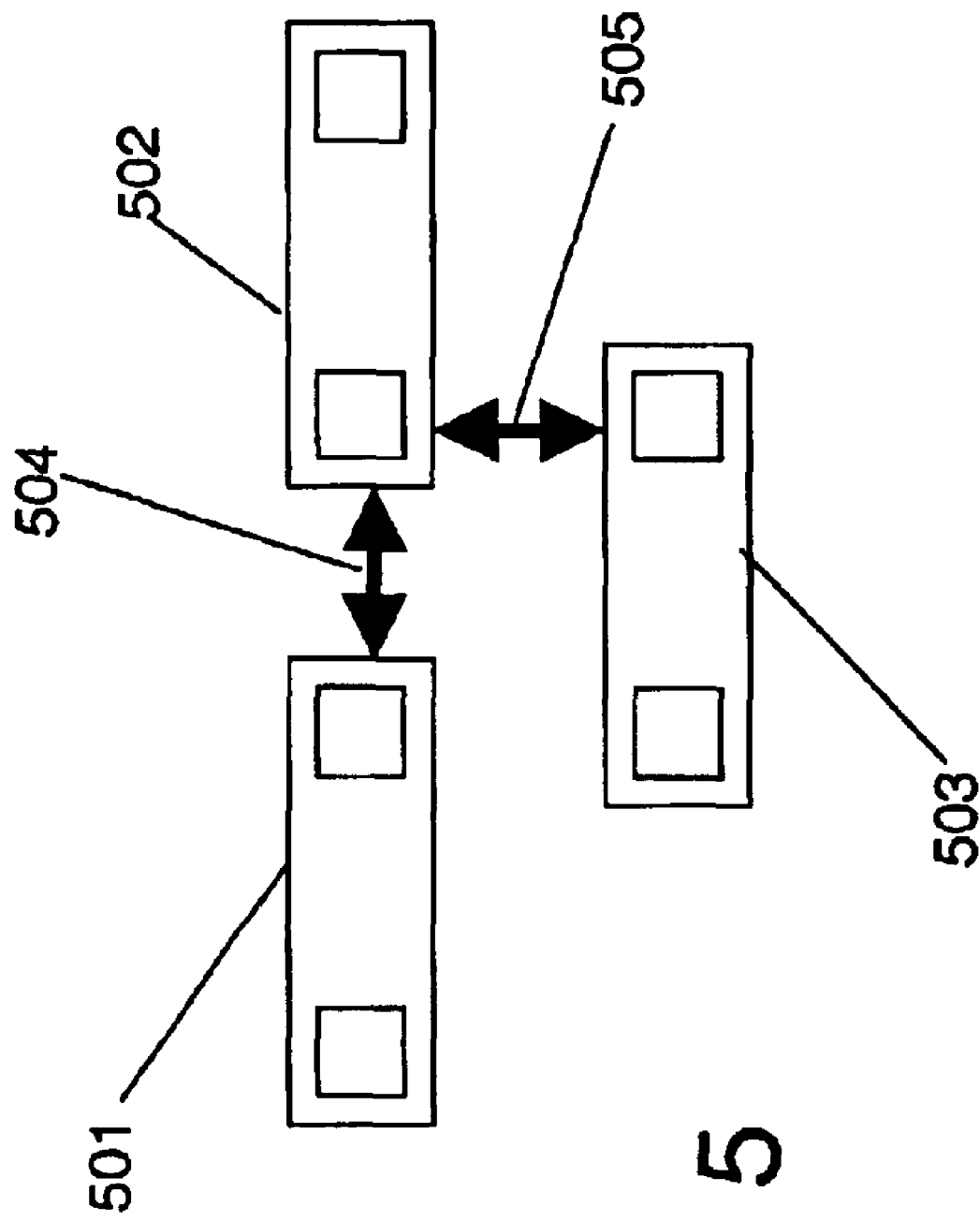
FIG. 5 shows structures, and possible paths (indicated by arrows) in which short circuits can occur due to misalignment between layers.

FIG. 5 shows structures 501–503, and possible paths (indicated by arrows 504, 505) in which short circuits can occur due to misalignment between layers. The test vehicle structures of the prior art do not allow a characterization of the line end shortening effect, which requires that possible paths for horizontal as well as vertical short circuits as illustrated in FIG. 5 can be explored. It would be desirable to allow checking for open and short circuits.

Defect inspection is desired for process control and to enhance chip yield. Electrical measurements of chain type test structures are commonly used to detect ILD open circuit faults in via and contact layers. In submicron DUV and beyond lithography steps, line end shortening effects have become a significant yield loss mechanism of product chips. Line end shortening effects cannot be explored by existing chain type test structures, since this failure mechanism can cause both via open circuit faults as well as metal short circuit faults. To electrically detect and separate both fault types we present a novel zig-zag structure. In the exemplary embodiments, two or more independently measurable via chains are built, such that the upper and lower conducting layer have a different routing direction, which enables the separation between short circuit faults and open circuit faults in all directions. Thus, it is possible to optimize product chip layouts by balancing yield loss due to systematic and random short circuits against yield loss due to systematic and random open circuits. The usage of different routing directions per conducting layer better reflects what is used in today's highly complex product chips to support auto-routing of circuit and system components. The zig-zag test structure mask can be used as a short flow to guarantee a short turn around time for fast process data extraction.

Figure 6:
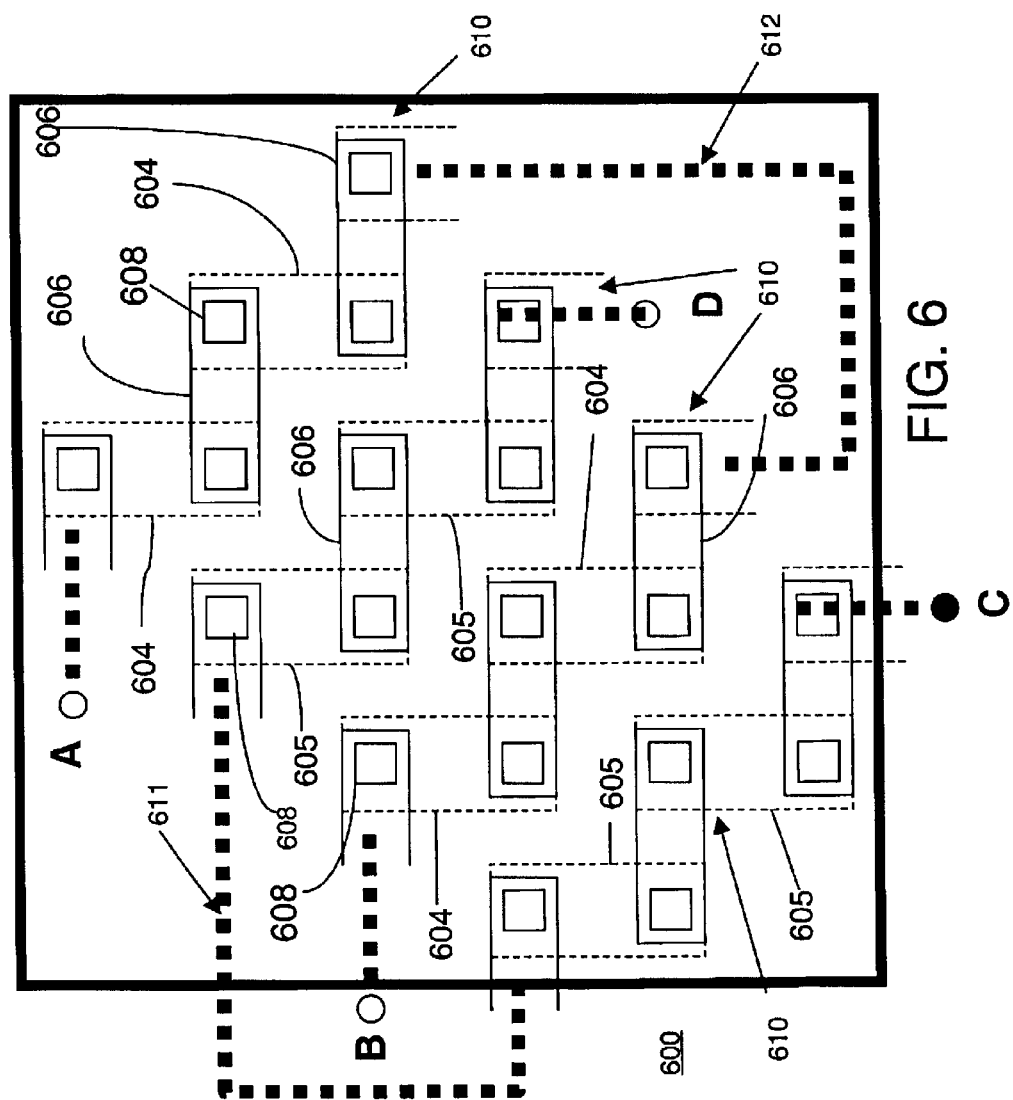
FIG. 6 is plan view of a test vehicle having exemplary zig-zag structures.

FIG. 6 is a diagram of a first exemplary test vehicle 600 having a plurality of zig-zag structures 610 (also referred to herein as "zig-zag chains"). At least one of the zig-zag structures comprises a first layer having a plurality of first elongated patterns 604, 605 (shown in phantom) oriented in a first direction (e.g., shown as vertical in FIG. 6). Each individual zig-zag structure 610 is formed by alternating lower layer patterns and upper layer patterns.

In the test vehicle 600, the patterns 604 and 605 alternate within each column of patterns. The columns of patterns 604, 605 are staggered in the vertical direction, so that each pattern is offset in the vertical direction from the patterns in the adjacent columns on both sides thereof. Each pattern 604 is adjacent to one pattern 604 and one pattern 605 at its top end. Each pattern 604 is adjacent to one pattern 605 and one pattern 604 at its bottom end.

A second layer has a plurality of second elongated patterns 606 oriented in a second direction substantially perpendicular to the first direction. In FIG. 6, the second elongated patterns 606 are oriented horizontally. In the example, the patterns 606 are metal.

A plurality of vias or contacts 608 conductively couple consecutive ones of the first patterns 604 and 605 to respective ones of the second patterns 606. Thus, when the connected patterns 604–606 in both the first and second layers are viewed together, ones of the first and second patterns lie in zig-zag configurations 610 that form the plurality of zig-zag structures. FIG. 6 partially shows four zig-zag structures 610, but a test vehicle may have any number of such structures.

Although the upper layer pattern 606 usually is a metal BEOL (back end of line) layer, the lower layer patterns 604, 605 can be either P-Si or Active Area (AA). Within a single zig-zag chain, the lower layer patterns are formed from one material. Some chains are formed by alternating patterns 604 (lower layer) and 606 (upper layer); other chains are formed by alternating patterns 605 and 606. In some embodiments, patterns 604 are P-Si, and patterns 605 are active areas comprising doped semiconductor material. In this case, the chains 610 alternate between P-Si and active area. In other embodiments, patterns 605 may be either P-Si or active areas comprising doped semiconductor material. Then, some or all of the chains 610 may be P-Si. This may better reflect the topology of product chips which further improves yield prediction.

The zig-zag structures 610 enable horizontal and vertical short circuits (due to inter-layer misalignments) to be distinguished. The zig-zag structures 610 allow the design of experiment to incorporate OPC (Optical Proximity Correction)/Border comb experiments and contact chain experiments in one cell design to save chip area and pads.

Optionally, connecting paths 611 and 612 may be provided, so that there two non-adjacent zig-zag chains can be interwoven to check for open contacts. For example, path 611 joins two chains to form a path connecting pin A and pin B. Similarly, path 612 joins two chains to form a path connecting pin C and pin D. This allows the design of experiment to check for short circuits between pins A and B and/or to check for short circuits between pins C and D. In the exemplary embodiment, the paths 611 and 612 are formed in the metal layer. In other embodiments, the connecting paths are optionally (but not necessarily) routed on a third layer.

Zigzag chains enable checking for short circuits between adjacent patterns 606 in the horizontal direction within the same row of patterns, and also enable checking for short circuits between partially overlapping patterns 606 within two adjacent rows of patterns in the vertical direction. Thus, both horizontal shorts 504 and vertical shorts 505 could be identified using zig-zag structures 610.

Figure 7:
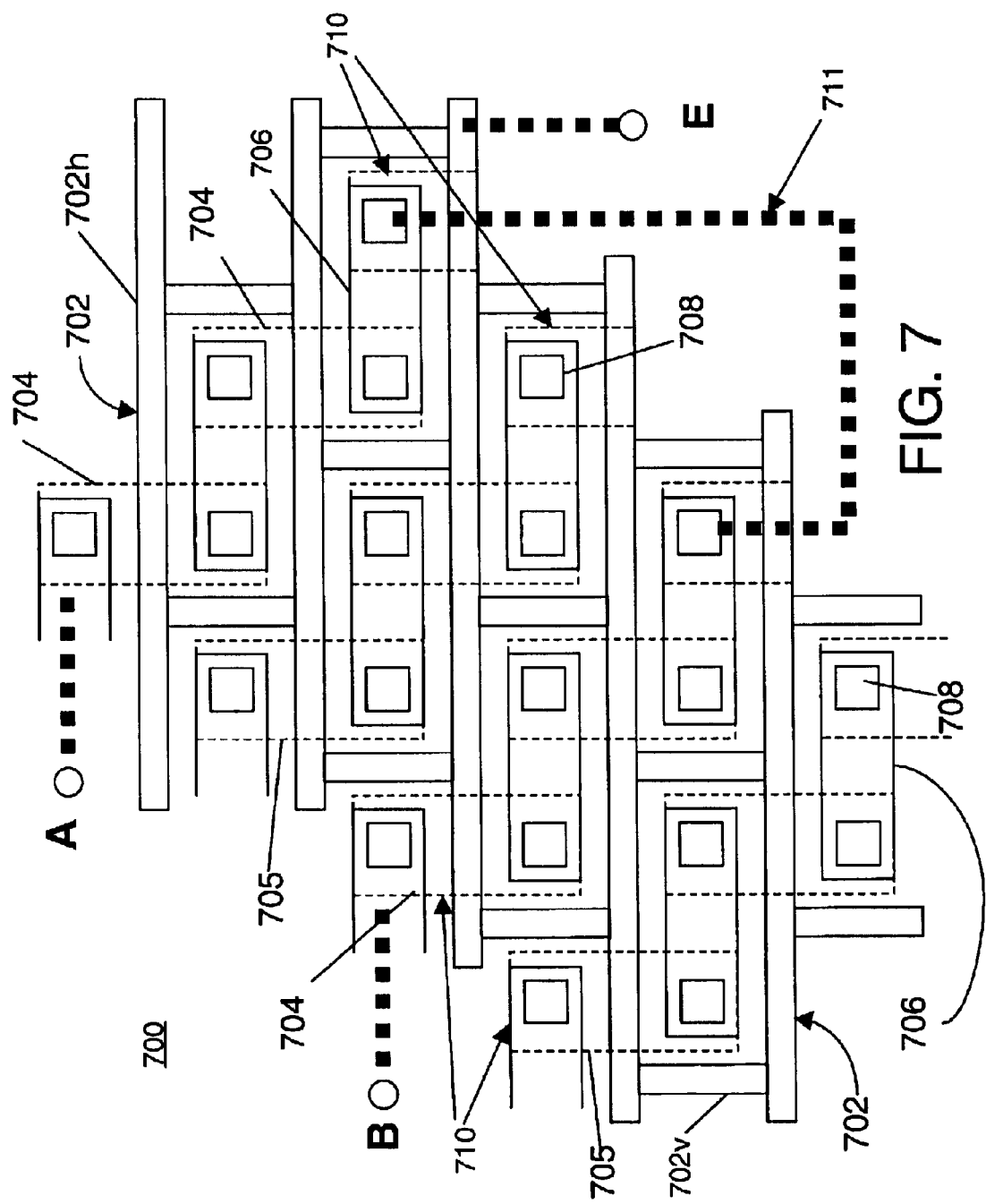
FIG. 7 shows another exemplary embodiment of a test vehicle having an additional "neighborhood" structure.

FIG. 7 shows another exemplary embodiment of a test vehicle 700 further comprising an additional "neighborhood" structure 702 (which may be metal or polysilicon) for evaluating the effect of neighborhood structures on the line end shortening effect and the vertical short circuit effect. The test vehicle 700 also includes a first layer with patterns 704 and 705, a second layer with patterns 706, and contacts and vias 708, which may be similar to the corresponding structures 604, 605, 606 and 608, respectively, as described above. The exemplary neighborhood pattern 702 includes a plurality of horizontal members 702*h* connected by staggered vertical members 702*v* to form a plurality of rectangular cells, each cell surrounding a respective one of the second patterns 706. The horizontal members 702*h* lie between the second patterns 706 and overlap ones of the first patterns 704, 705. The vertical members 702*v* lie between the second patterns 706 and lie between adjacent portions of neighboring first layer patterns 704, 705.

FIG. 7 only shows a neighborhood structure 702 in one layer (the upper layer, i.e., metal layer), but neighborhood structures may be included in any of the layers. For example, neighborhood structure 702 can be placed in upper layer (metal) 706 and/or lower layer (P-Si 704 or active area 705). It is understood that neighborhood structures in the first (P-Si or AA) layer (not shown) would be located so that the cells of that neighborhood structure surround the P-Si or AA patterns, and overlap the second layer metal structures 706. Although the exemplary neighborhood structure includes rectangular cells surrounding rectangular patterns, the shape of the cells of the neighborhood structure can be modified to accommodate non-rectangular patterns (not shown), if the test vehicle includes non-rectangular test patterns.

The addition of the neighborhood structure 702 allows the design of experiment to check for short circuits between chain taps (pins A and B) and neighborhood metal or P-Si pin E.

Although FIG. 7 only shows one path 711 connecting two of the zig-zag chains 710, any number of pairs of zig-zag chains may be connected in similar fashion.

Table 1 includes a summary of examples of experiments that are possible with the exemplary test vehicles. The individual types of variations are described below, with reference to FIGS. 8–13.

TABLE 1

| Layout Experiment | Purpose |
| --- | --- |
| Loading | Check effects of hole density and metal density |
| Misalignment | Assess misalignment margin and improvements offered by borders (2) Characterize contact and metal misalignment separately |
| Size Variation (with large overlap) | Check effects of hole size variation independently of poly/active/metal coverage |
| Size Variation (with fixed, typical overlap) | Check hole size margin for typical overlap pattern (2) Separate top and bottom layer effects |
| Line end and border effects | Check effect of drawn overlap and line end neighborhood |
| contact/metal/poly Short Checks | Check metal/contact short as function of line end environment (iso, dense, misalign, etc.) |

Figure 8:
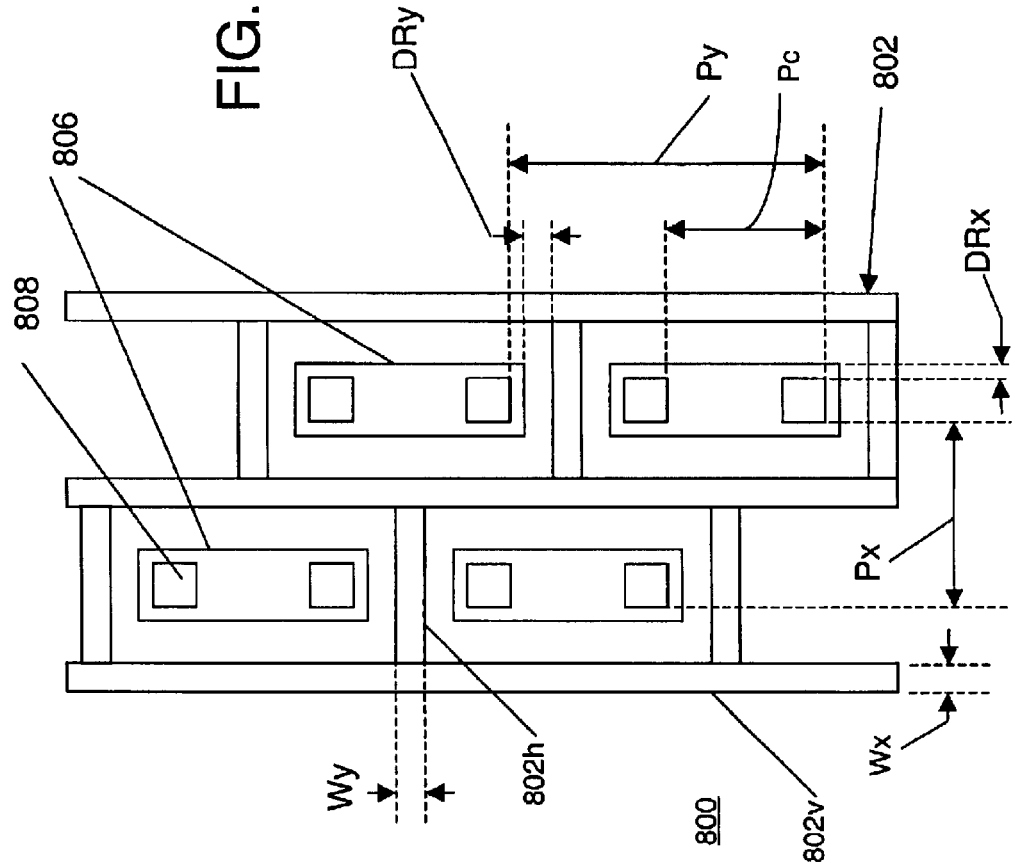
FIG. 8 shows a further exemplary structure for characterizing the effect of the span of density ranges between contacts in the X and Y directions.

FIG. 8 shows several parameters than can be varied in contact chain-loading (contact density) experiment. A test vehicle 800 has metal patterns 806, contacts 808, and a neighborhood pattern 802. Only the top (metal) layer is shown. The same parameters may be varied in neighborhood patterns 802 in the lower (P-Si or AA) and/or upper (metal) layer. Parameter that are varied may include: minimum density range space in the Y direction DRy, minimum density range space in the X direction DRx, vertical pitch Py between adjacent metal patterns, horizontal pitch Px between adjacent metal patterns, internal pitch Pc between contacts within a single pattern, width Wy of horizontal members 802*h*, and width Wx of vertical members 802*v*. The values for these parameters used in the experiments should span the density range seen in a product with several layers of density.

FIGS. 9A–9D show how the widths of the metal and P-Si and/or AA patterns can be varied in a contact-chain/size-variation experiment with large and typical taps. Different combinations of metal and P-Si and/or AA pattern widths may be used in respective zig-zag chains in different portions of the same test vehicle. FIG. 9A represents nominal sizes for P-Si (and/or AA) 904, metal 906 and contact 908 patterns. In FIG. 9B, the P-Si (and/or AA) 914, metal 916 patterns have a large width, and nominal size contacts 918 are used. The distance 919 may be varied. In FIG. 9C, the metal patterns 926 have a large width, but nominal size is used for P-Si/AA 924 and contacts 928. In FIG. 9D, the P-Si/AA patterns 934 have a large width, but nominal size is used for metal 936 and contacts 938. Large metal overlap is used to separate landing vs. coverage vs. hole effects. "Landing" means where the via or contact is with respect to the metal or poly or AA layer. "Coverage" means how much of the via or contact is actually covered with metal/P-Si/AA. Usually the entire via or contact should be covered, but due to misalignment, bad OPC and for other reasons, this does not always occur.

FIGS. 10A–10F shows how pattern lengths and borders can be varied between zig-zag chains within a test vehicle to conduct contact chain-line end and border experiments. Although FIGS. 10A–10F only show individual patterns within the metal layer, it will be understood that these patterns are incorporated into zig-zag chains in a test vehicle. These variations in structures may be used for characterizing the interaction between line extension and the neighborhood structures, with and without variations in the neighborhood structure. Although FIGS. 10A–10F show how the metal patterns are varied, the P-Si and/or AA patterns can be varied in the same way.

Figure 10B:
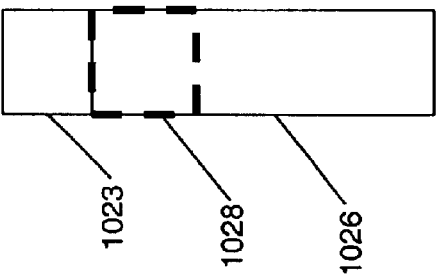
FIGS. 10A–10F show parameters that can be varied to study the effects of line extension and borders.
Figure 10C:
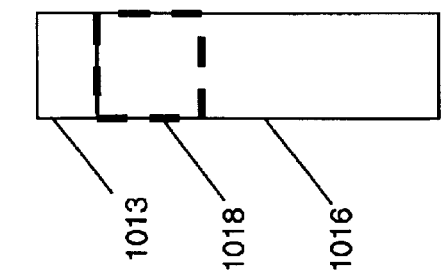
Figure 10D:
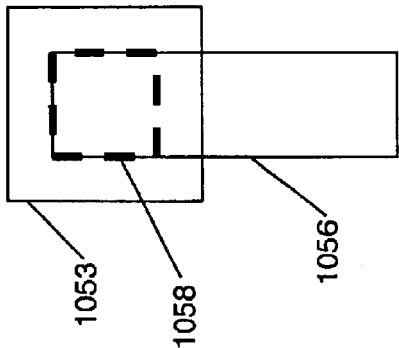
Figure 10E:
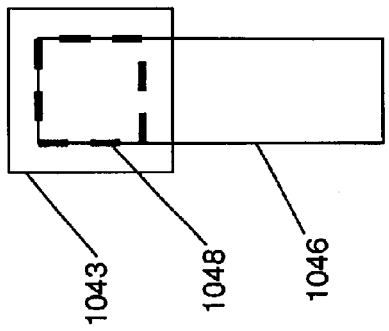
Figure 10F:
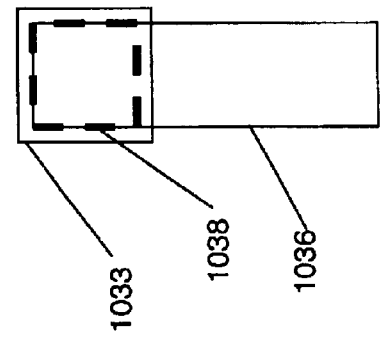
Figure 10A:
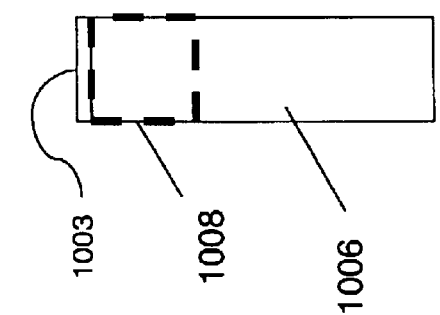

FIGS. 10A–10C show the line end variations. Lengths of the metal patterns are varied. FIG. 10B shows a metal pattern 1016 having a nominal line extension 1013 (according to a design rule) beyond the contact 1018. FIG. 10A shows a metal pattern 1006 having a line extension 1003 beyond the contact 1008 that is below the design rule. FIG. 10C shows a metal pattern 1026 having a line extension 1023 beyond the contact 1028 that is above the design rule.

FIGS. 10D–10F show the border variations. This essentially shows variations in the contact size. FIG. 10E shows a metal pattern 1046 having a nominal border 1013 (according to a design rule) around the contact 1018. FIG. 10D shows a metal pattern 1036 having a border 1033 around the contact 1038 that is below the design rule. FIG. 10F shows a metal pattern 1056 having a border 1053 around the contact 1058 that is above the design rule.

FIGS. 11A and 11B show alternative neighborhood structures for characterizing the interaction between line extension and the neighborhood structures. In FIG. 11A, the test vehicle 1100 has a neighborhood structure 1102, which may be the same as the neighborhood structure 702 shown in FIG. 7. Only a portion of the neighborhood structure 1102 is shown in FIG. 11A. In neighborhood structure 1102, the neighborhood metal is at a "fixed location," i.e., each well of the structure 1102 same length. A distance between the neighborhood pattern 1102 and adjacent patterns is varied in different portions of the test vehicle 1100. The metal patterns 1106, 1116, 1126 and 1136 in the wells have different extension lengths of zero, 1113, 1123 and 1133, respectively, past the respective contacts 1108, 1118, 1128 and 1138. The distance between the extensions 1113, 1123 and 1133 and the bottom of its respective well varies. In the example, pattern 1106 has no extension, pattern 1116 has an extension 1113 below the design rule, pattern 1126 has an extension 1123 equal to the design rule, and pattern 1136 has an extension 1133 above the design rule.

In FIG. 11B, test vehicle 1150 has a neighborhood structure 1152 in the, with the base of each well of the neighborhood metal structure 1152 at a fixed distance from its respective line end (or line extension). The metal patterns 1166, 1176, 1186 and 1196 in the wells have different extension lengths of zero, 1173, 1183 and 1193, respectively, past the respective contacts 1168, 1178, 1188 and 1198. The distance between the extensions 1173, 1183 and 1193 and the bottom of its respective well is held constant. In the example, pattern 1166 has no extension, pattern 1176 has an extension 1173 below the design rule, pattern 1186 has an extension 1183 equal to the design rule, and pattern 1196 has an extension 1193 above the design rule.

Although the examples in FIGS. 11A and 11B only show experiments involving the line end, similar experiments using the neighborhood structures 1102 and 1152 (or other neighborhood structures) may be performed in which the contact borders are varied in the manner shown in FIGS. 10D–10F. Although the embodiments in FIGS. 11A and 11B only include a single neighborhood structure line between any pair of adjacent patterns, other embodiments are contemplated in which the pitch between vias is relatively large, and two or more neighborhood pattern lines are interposed between adjacent vias.

Figure 12C:
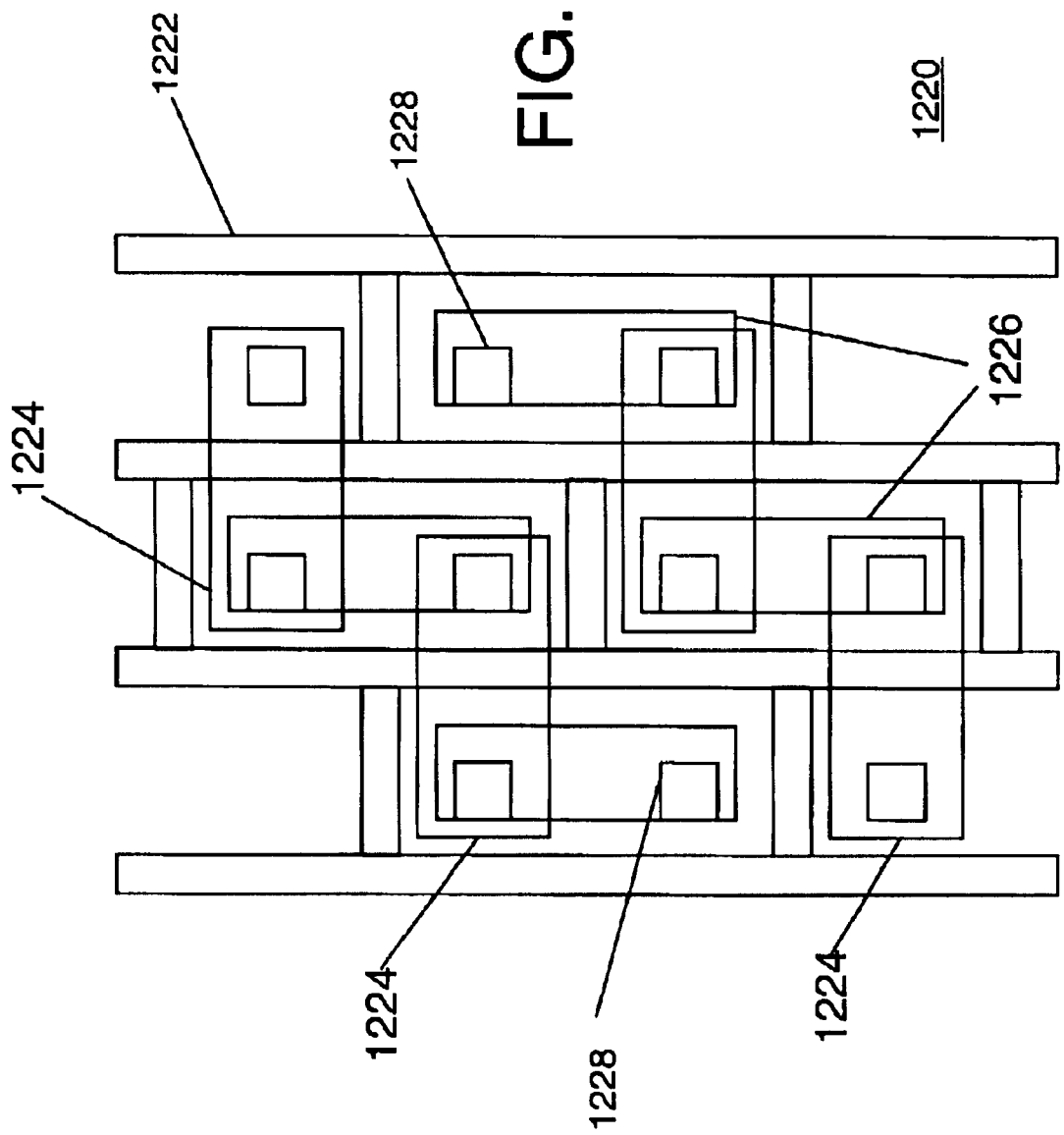
Figure 13:
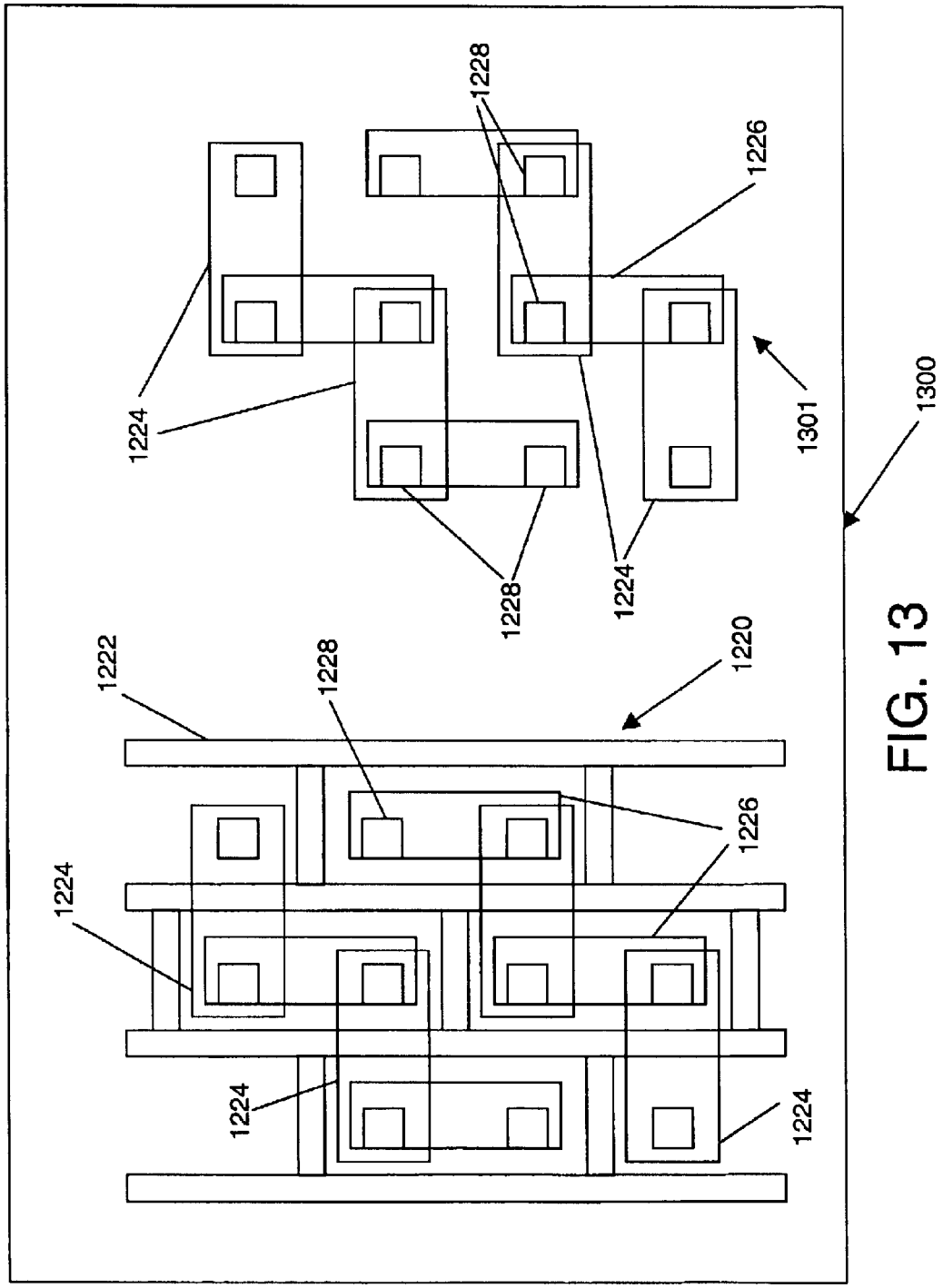
FIG. 13 shows the effect of a misalignment between the top layer and the neighborhood structures.

FIGS. 12A–13 show three experiments that can be performed to evaluate the effects of misalignments. The alignment between the neighborhood pattern and one of the group consisting of the first patterns, the second patterns, and the vias or contacts is varied in different portions of these test vehicles. To measure the mis-alignment, the resistance of each chain is measured. If the chains are mis-aligned, the coverage of the vias will go below 100%, and thus the resistance increases. If the resistance is above a certain threshold, this considered to be a yield failure.

FIG. 12A shows a portion of a test vehicle 1200 having a plurality of zig-zag structures, including P-Si (or AA) patterns 1204, metal patterns 1206 and contacts 1208. The patterns 1204 and 1206 and contacts 1208 are all properly aligned relative to the neighborhood structure 1202.

There is always a metal/P-Si/AA pattern connecting two vias/contacts. If a virtual line is drawn between these two vias a direction (horizontal or vertical) is defined. The misalignment is perpendicular to this direction. FIG. 12B shows the metal patterns 1216 in the horizontal direction; thus the misalignment is in up or down direction. In FIG. 12C, the metal patterns 1226 are drawn in the "vertical" direction, thus the misalignment is in the left or right direction.

FIG. 12B shows a portion of a test vehicle 1210 having a plurality of zig-zag structures, including P-Si (or AA) patterns 1214, metal patterns 1216 and contacts 1218. The metal patterns 1216, contacts 1218 and neighborhood structure 1212 are shifted upwards relative to the P-Si patterns 1214. The contacts 1218 are mis-aligned with respect to the P-Si (or AA) patterns 1214, and the contacts do not have the proper border. Although only one example of contact mis-alignment is shown in FIG. 12B, the experiment may include varying the amount of mis-alignment to have a plurality of degrees of contact offset relative to the correct alignment.

FIG. 12C shows a portion of a test vehicle 1220 having a plurality of zig-zag structures, including P-Si/AA patterns 1224, metal patterns 1226 and contacts 1228. In this experiment, the top layer patterns (metal 1226 and neighborhood structure 1222) are shifted to the right, relative to the bottom (P-Si/AA) layer patterns 1224. The metal patterns 1226 and the neighborhood structure 1222 are mis-aligned relative to the contacts 1228. Also, the metal patterns 1226 and neighborhood structure 1222 are mis-aligned relative to the bottom layer (P-Si/AA) patterns 1224. Although only one example of contact mis-alignment is shown in FIG. 12C, the experiment may include varying the amount of mis-alignment to have a plurality of degrees of contact offset relative to the correct alignment.

FIG. 13 shows an additional variation that can be added to the design of experiment, in which the top and bottom layers are mis-aligned with and without a neighborhood pattern. FIG. 13 shows a test vehicle 1300 for evaluating the effect of a misalignment between the top layer and the neighborhood structures. A set of patterns 1220 (as described above with reference to FIG. 12C) is included on the left. On the right, a set of patterns 1301 including the same P-Si/AA patterns 1224, metal patterns 1226 and contacts 1228 are provided without the neighborhood structure 1222. Mis-aligned yield/resistance is checked with and without the metal neighborhood structure 1222 to assess typical via environments found on product chip.

Although the term "Contact Chain" is used herein, this approach is not limited to contact chains only, it can be applied to all kind of "vias" between two adjacent layers of conducting material (e.g. "via chain" between "metal 1" and "metal 2.

Although the examples described above only include two pattern layers, other embodiments include more than two pattern layers. For example, a test vehicle may include three metal layers, designated M1, M2 and M3. In this example, a first zig-zag chain includes patterns in the M1 and M2 layers; a second zig-zag chain includes patterns in the M2 and M3 layers. The third zig-zag chain (and subsequent odd numbered chains) include M1 and M2 patterns. The fourth (and subsequent even numbered chains) include M2 and M3 patterns.

Although the examples described above include alternating chains of two different types, other embodiments include three or more consecutive zig-zag chains, all of which have respectively different materials.

Although the exemplary embodiments are short flow test vehicles, the concepts described above can be readily extended to more complex test vehicles, including full flow test vehicles.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A test vehicle having a plurality of zig-zag structures, wherein at least one of the zig-zag structures comprises:
   a first layer having a plurality of first elongated patterns oriented in a first direction;
   a second layer having a plurality of second elongated patterns oriented in a second direction different from the first direction; and
   a plurality of vias or contacts conductively coupling ones of the first patterns to respective ones of the second patterns, wherein the zig-zag structures alternate between a clockwise turn and a counter-clockwise turn at each successive via or contact.

2. A test vehicle having a plurality of zig-zag structures, wherein at least one of the zig-zag structures comprises:
   a first layer having a plurality of first elongated patterns oriented in a first direction;
   a second layer having a plurality of second elongated patterns oriented in a second direction substantially perpendicular to the first direction; and
   a plurality of vias or contacts conductively coupling ones of the first patterns to respective ones of the second patterns.

3. The test vehicle of claim 2, wherein ones of Ahe first and second patterns lie in a zig-zag configuration that forms one of the plurality of zig-zag structures, consecutive ones of the patterns in the zig-zag configuration being conductively coupled by ones of the vias or contacts.

4. The test vehicle of claim 3, further comprising a neighborhood pattern overlapping ones of the first patterns.

5. The test vehicle of claim 4, wherein a distance between the neighborhood pattern and adjacent second patterns is varied in different portions of the test vehicle.

6. The test vehicle of claim 4, wherein alignment between the neighborhood pattern and one of the group consisting of the first patterns, the second patterns, and the vias or contacts is varied in different portions of the test vehicle.

7. The test vehicle of claim 2, wherein, the first patterns are selected from the group consisting of semiconductor and active areas of doped semiconductor, and the second patterns are metallizations.

8. The test vehicle of claim 7, wherein the first patterns are formed from a single material.

9. The test vehicle of claim 7, wherein the first patterns in the plurality of the zig-zag structures are formed of two different materials which are alternated between successive zig-zag structures.

10. The test vehicle of claim 2, wherein a spacing between adjacent vias or contacts is varied in different portions of the test vehicle.

11. The test vehicle of claim 2, wherein widths of the first patterns are varied in different portions of the test vehicle.

12. The test vehicle of claim 2, wherein widths of the second patterns are varied in different portions of the test vehicle.

13. The test vehicle of claim 2, wherein lengths of the first patterns are varied in different portions of the test vehicle.

14. The test vehicle of claim 2, wherein lengths of the second patterns are varied in different portions of the test vehicle.

15. The test vehicle of claim 2, wherein a size of the vias or contacts is varied in different portions of the test vehicle.

16. The test vehicle of claim 2, further comprising a connecting path that connects at least two zig-zag structures.

* * * * *